(12) United States Patent
Obata et al.

(10) Patent No.: US 7,972,884 B2
(45) Date of Patent: Jul. 5, 2011

(54) MICROMECHANICAL DEVICE AND METHOD OF MANUFACTURING MICROMECHANICAL DEVICE

(75) Inventors: Susumu Obata, Yokohama (JP);
Michinobu Inoue, Yokohama (JP);
Takeshi Miyagi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 12/399,348

(22) Filed: Mar. 6, 2009

(65) Prior Publication Data
US 2009/0236114 A1 Sep. 24, 2009

(30) Foreign Application Priority Data

Mar. 19, 2008 (JP) ................. 2008-071571

(51) Int. Cl.
*H01L 21/00* (2006.01)
(52) U.S. Cl. ................. 438/48; 257/E29.323
(58) Field of Classification Search .......... 438/48, 438/50, 52, 120, 472; 257/E21.518, E27.006, 257/E29.324, E21.613, E29.323; 200/181
See application file for complete search history.

(56) References Cited

U.S. PATENT DOCUMENTS

| 7,008,812 B1 | 3/2006 | Carley |
| 2003/0034239 A1* | 2/2003 | Chason et al. ................. 200/181 |
| 2006/0065941 A1* | 3/2006 | Delapierre .................... 257/414 |

FOREIGN PATENT DOCUMENTS

| JP | 2005-207959 | 8/2005 |
| JP | 2006-60966 | 3/2006 |

* cited by examiner

*Primary Examiner* — David Vu
*Assistant Examiner* — Shaun Campbell
(74) *Attorney, Agent, or Firm* — Oblon, Spivak, McClelland, Maier & Neustadt, L.L.P.

(57) ABSTRACT

An example of the present invention is a micromechanical device including, a substrate in which a signal line is provided, a micromachine which is mounted on the substrate, is formed of a conductive material into a beam-like shape, is elastically deformed by a function of an electric field in such a manner that the beam-like part moves closer to or apart from the signal line, and changes the electric characteristics concomitantly with the deformation, a deformation restraint section constituted of a material having a higher viscosity coefficient than the conductive material, provided on the opposite side of the micromachine to the signal line, for restraining deformation of the micromachine in a direction in which the micromachine is separated from the signal line, and a sealing body provided on the principal surface of the substrate, for covering the micromachine with a hollow section located therebetween.

3 Claims, 14 Drawing Sheets

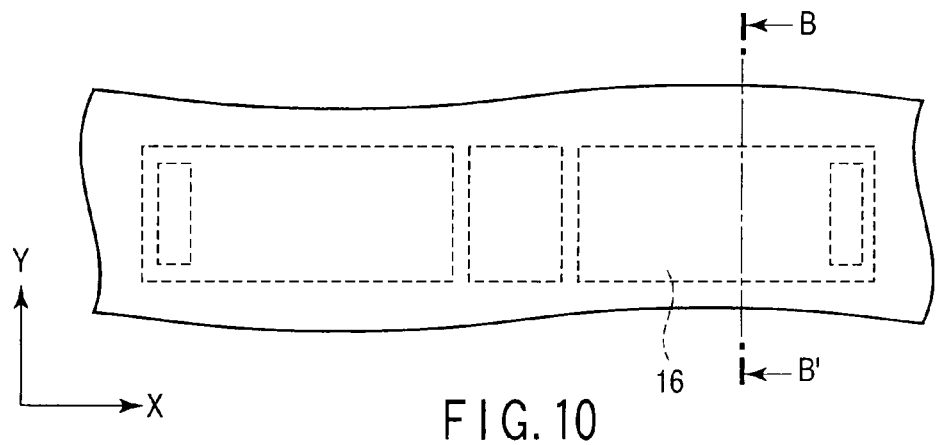
F I G. 10
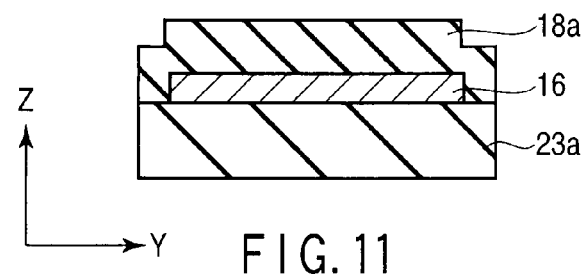
F I G. 11
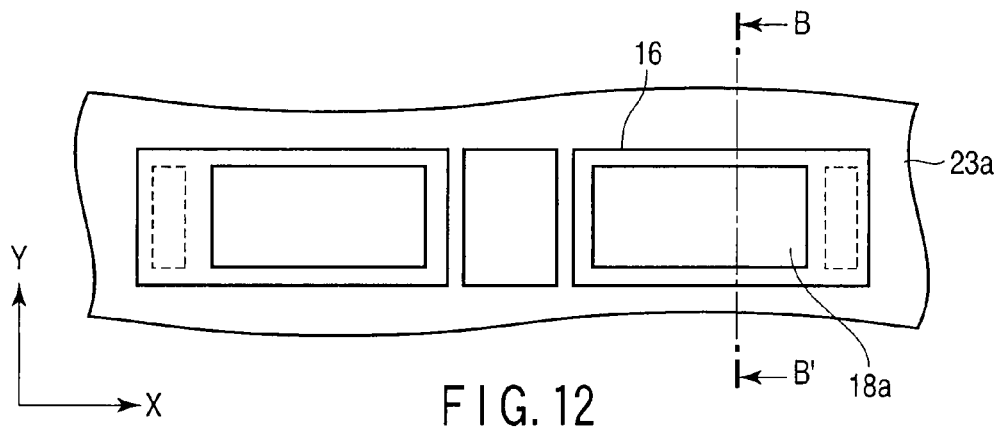
F I G. 12
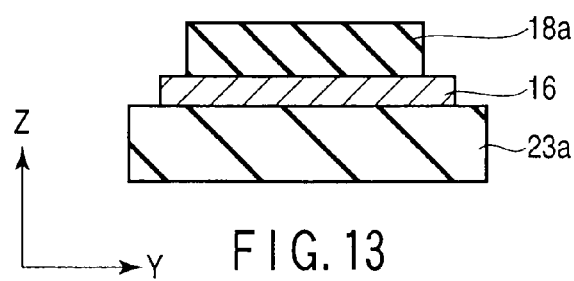
F I G. 13

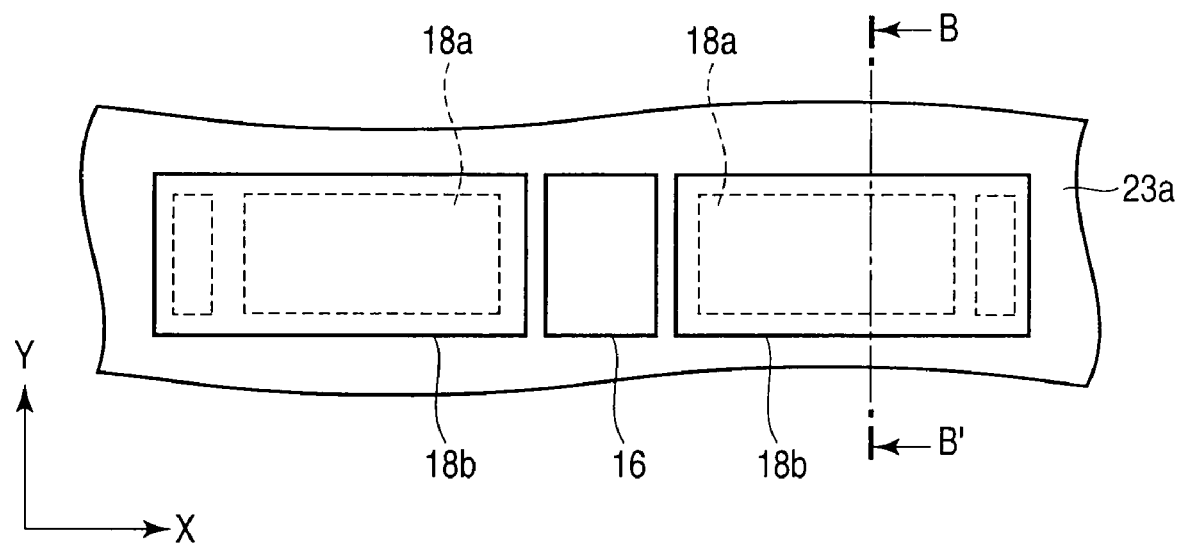
F I G. 14
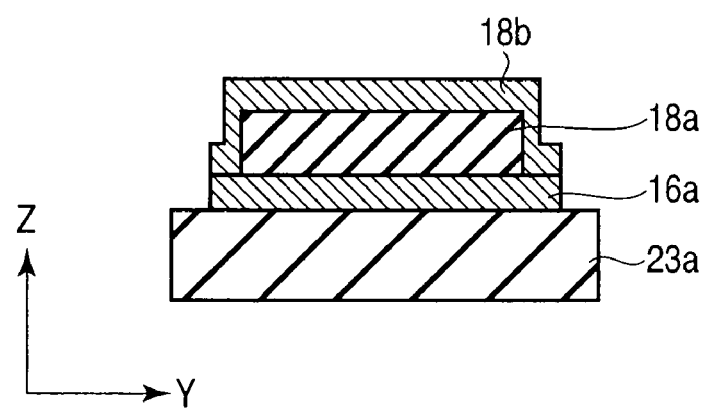
F I G. 15

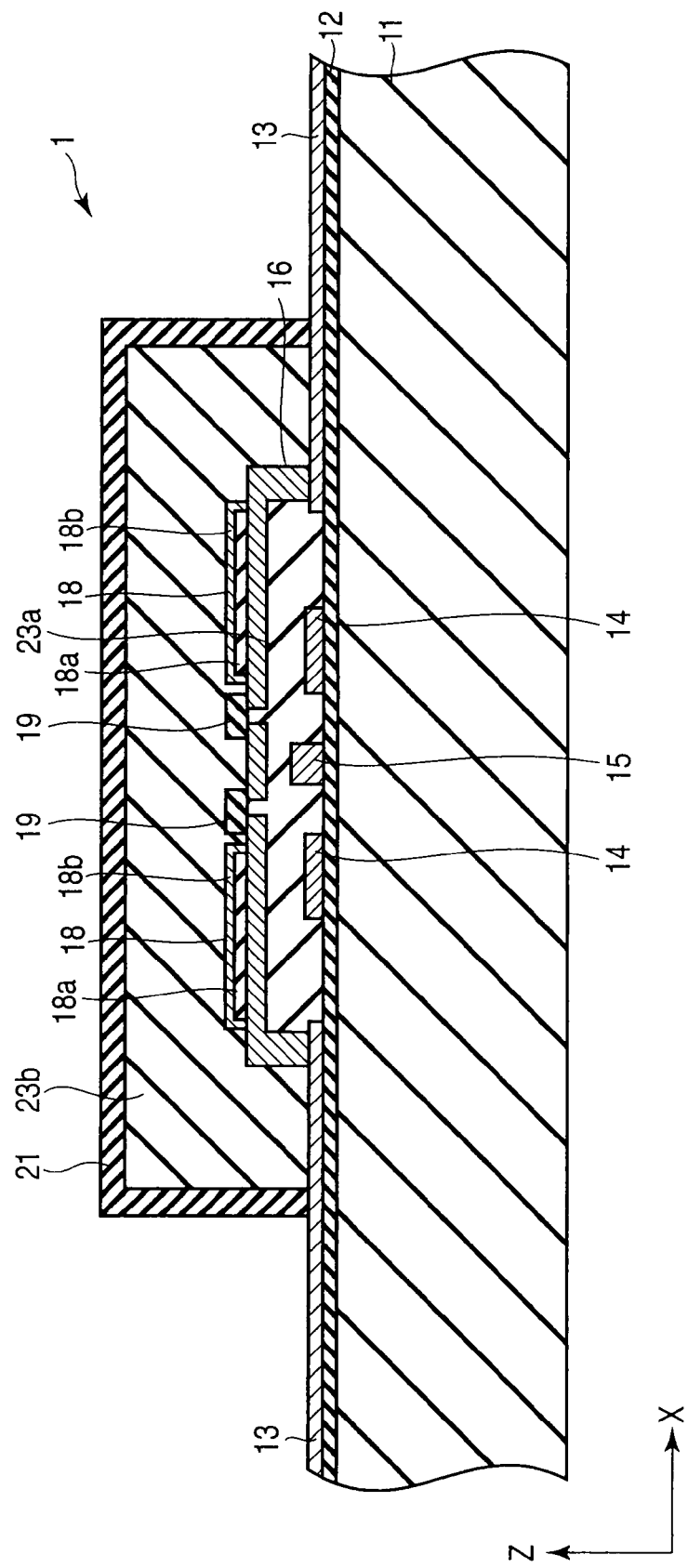
F I G. 17

MICROMECHANICAL DEVICE AND METHOD OF MANUFACTURING MICROMECHANICAL DEVICE

CROSS-REFERENCE TO RELATED APPLICATIONS

This application is based upon and claims the benefit of priority from prior Japanese Patent Application No. 2008-071571, filed Mar. 19, 2008, the entire contents of which are incorporated herein by reference.

BACKGROUND OF THE INVENTION

1. Field of the Invention

The present invention relates to a micromechanical device such as packaging of a micro-electro-mechanical-systems, and a method of manufacturing the micromechanical device.

2. Description of the Related Art

As an example of the micromechanical device, Micro-Electro-Mechanical-Systems (MEMS) 101 in which a MEMS element 104 as a micromachine having a motion is mounted on a substrate 102, and is sealed in a hollow state as shown in FIGS. 19 to 21 are known. Such an example is shown in, for example, Jpn. Pat. Appln. KOKAI Publication No. 2005-207959 or U.S. Pat. No. 7,008,812B1.

The MEMS 101 is constituted of a substrate 102, an insulating layer 103, a MEMS element 104, signal wiring 105, drive electrodes 106, a lower electrode 107, a first sealing body 108, and a second sealing body 109, and a hollow section 110 is configured inside. The first sealing body 108 has holes 108a. The MEMS element 104 has a double-supported or cantilever beam structure, in which the beam is formed in such a manner that a gap of several μm is held between a central part of the beam and the signal wiring 105. In the insulating layer 103 directly under the MEMS element 104, the signal wiring 105 is formed by using Au or the like. The MEMS element 104 is constituted of poly-Si or Al having high spring characteristics, and gets closer to the signal wiring 105 side by being given drive force such as electrostatic force or the like.

Further, when the drive force is removed, the MEMS element 104 is restored to the position in which the element 104 has a gap between itself and the signal wiring 105 by its own spring characteristics. By changing the gap between the MEMS element 104 and the signal wiring 105 as described above, the MEMS element 104 performs functions of variable electrostatic capacity, switching, and the like.

In a MEMS 101 of such a type, for the operation and protection of the MEMS element 104, the MEMS element 104 is sealed in a hollow state. The hollow section 110 is a reduced atmosphere.

However, in the technique described above, there has been the following problem. That is, in the MEMS element as a beam-like micromachine, the vibration occurring when the electrostatic force is removed is hard to be settled because of the spring characteristics, which becomes a cause of noise contained in the output signal. Particularly, in the reduced atmosphere of the hollow section, the fluid resistance is small, and hence it is difficult to settle the vibration of the micromachine.

The present invention has been contrived to solve the above problem, and an object thereof is to provide a micromechanical device capable of reducing noise in the output signal by making the vibration of the micromachine easy to be settled, and a method of manufacturing the micromechanical device.

BRIEF SUMMARY OF THE INVENTION

An example of the present invention is a micromechanical device comprising, a substrate in which a signal line is provided on a principal surface, a micromachine which is mounted on the principal surface of the substrate, is formed of a conductive material into a beam-like shape, is elastically deformed by a function of an electric field in such a manner that the beam-like part moves closer to or apart from the signal line, and changes the electric characteristics concomitantly with the deformation, a deformation restraint section constituted of a material having a higher viscosity coefficient than the conductive material, provided on the opposite side of the micromachine to the signal line, for restraining deformation of the micromachine in a direction in which the micromachine is separated from the signal line, and a sealing body provided on the principal surface of the substrate, for covering the micromachine with a hollow section located therebetween.

An another example of the present invention is a method of manufacturing a micromechanical device comprising, a step of arranging a micromachine which is formed of a conductive material into a beam-like shape, is deformed by a function of an electric field, and changes the electric characteristics concomitantly with the deformation, on a principal surface of a substrate on which a signal line is provided, a step of arranging deformation restraint sections each constituted of a material having a higher viscosity coefficient than the conductive material, for restraining deformation of the micromachine by which the micromachine is separated from the signal line, on the opposite side of the micromachine to the signal line, a step of forming a sacrificial layer on the micromachine and the deformation restraint sections, a step of forming a first sealing body covering the micromachine with the sacrificial layer located therebetween, and including opening shape sections communicating with the sacrificial layer, on the sacrificial layer and the principal surface of the substrate, a step of introducing a fluid for removing the sacrificial layer from the opening shape sections to thereby remove the sacrificial layer, and a step of forming a second sealing body on the first sealing body to thereby block the opening shape sections.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 10 is a plan view showing a manufacturing process of the micromechanical device;

FIG. 11 is a cross-sectional view showing a manufacturing process of the micromechanical device;

FIG. 12 is a plan view showing a manufacturing process of the micromechanical device;

FIG. 13 is a cross-sectional view showing a manufacturing process of the micromechanical device;

FIG. 14 is a plan view showing a manufacturing process of the micromechanical device;

FIG. 15 is a cross-sectional view showing a manufacturing process of the micromechanical device;

FIG. 17 is a cross-sectional view showing a manufacturing process of the micromechanical device;

DETAILED DESCRIPTION OF THE INVENTION

Figure 1:
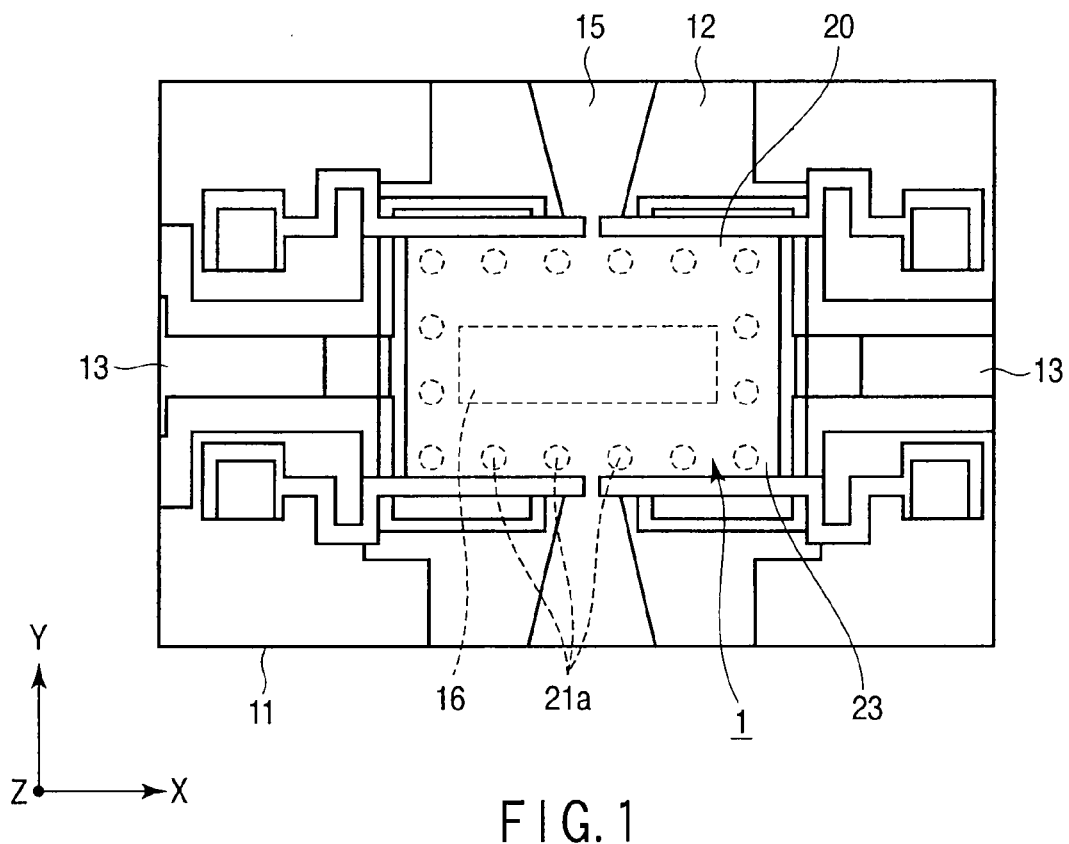
FIG. 1 is a plan view showing a micromechanical device according to an embodiment of the present invention.
Figure 3:
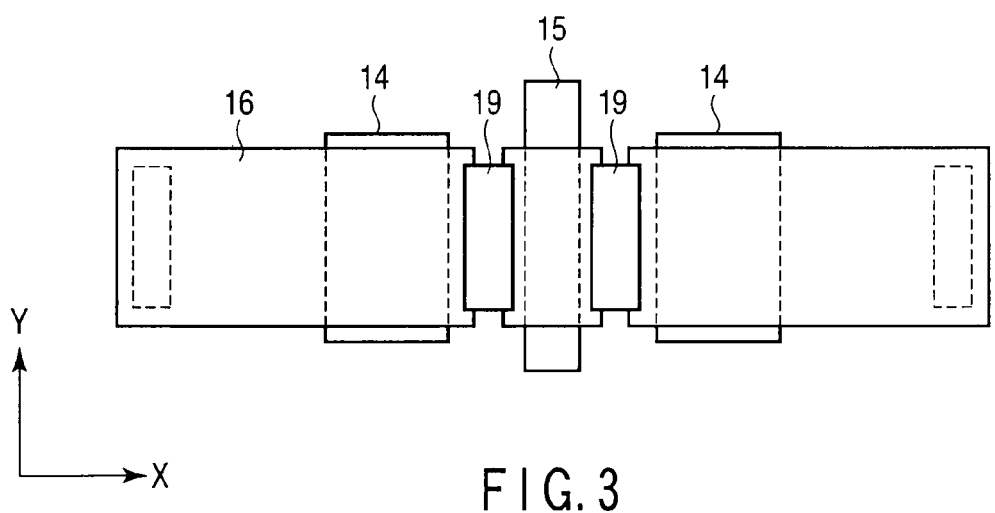
FIG. 3 is a plan view showing a main part of the micromechanical device.
Figure 2:
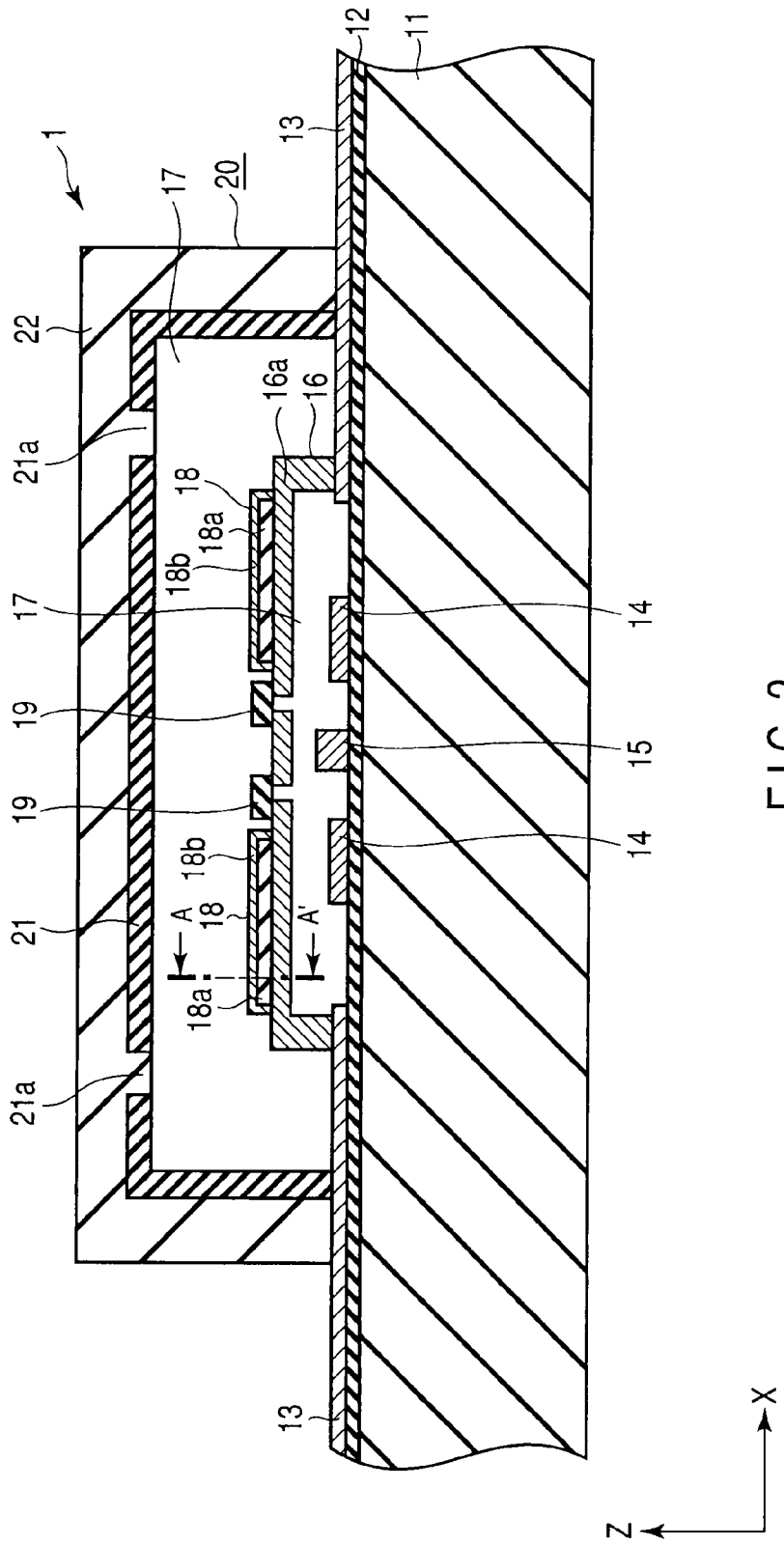
FIG. 2 is a cross-sectional view of the micromechanical device.

A micromechanical device 1 according to a first embodiment of the present invention will be described below with reference to FIGS. 1 to 3. It should be noted that in each drawing, the configuration is schematically shown by appropriately enlarging, reducing, and omitting the configuration. In FIGS. 1 to 3, X, Y, and Z each indicate three directions perpendicular to each other.

The micromechanical device 1 is, for example, Micro-Electro-Mechanical-Systems (MEMS), and includes a base substrate 11 constituting a substrate, an insulating layer 12, signal wiring 15 (signal line), a MEMS element 16 (micromachine), deformation restraint sections 18, and the like. Further, the MEMS element 16 is sealed airtight by a combination of a sealing body 20 with the substrate, and a cross-sectional surface of the MEMS element 16 is shown in the figures as surface 16a. An atmosphere of a gas of normal pressure is sealed in a hollow section 17 which is formed in the sealing body 20. The sealing body 20 is constituted by stacking a first sealing body 21 defining the hollow section 17, and a second sealing body 22 one on top of the other in the order mentioned.

The base substrate 11 is a silicon (Si) substrate, a glass substrate, or a sapphire substrate, and is formed into a predetermined plate-like shape.

The insulating layer 12 is formed on the base substrate 11, and is constituted of, for example, a silicon oxide film ($SiO_2$). The substrate is constituted of the base substrate 11, and the insulating layer 12.

A lower electrode 13, drive electrodes 14, signal wiring 15, and a MEMS element 16 are formed on the top surface of the insulating layer 12. The signal wiring 15 is formed of Au or the like, and is formed to extend in the Y direction in FIG. 2. The drive electrodes 14 are formed on the insulating layer 12 on both sides of the signal wiring 15 with the signal wiring interposed between the electrodes 14.

The MEMS element 16 is formed on the top surface of the insulating layer 12. The MEMS element 16 is connected to the lower electrode 13 leading to the outside of the sealing body 20. The signal wiring 15 is formed of Au or the like on the surface of the insulating layer 12 under the MEMS element 16.

The MEMS element 16 is a movable mechanism section of the micromachine, has a double-supported beam-like shape, both end parts thereof are connected to the lower electrode 13, and the central part of the beam-like shape is arranged separate from the signal wiring 15 with a gap of about several μm held between the central part and the wiring 15. It is possible to secure the gap structure through, for example, a manufacturing process for forming a MEMS element 16 on a sacrificial layer 23a having a thickness of about several μm as will be described later.

In the MEMS element 16, rectangular plate-like members constituted of a conductive material such as poly-Si, and Al are connected to each other by connection joints 19 each of which is formed of an insulating material such as $SiO_2$ into a rectangular plate-like shape. The plate-like member directly above the signal wiring 15, and the cantilever beam-like members on both sides of the signal wiring 15 in the direction in which the signal wiring 15 is straddled are connected to each other by the connection joints 19 arranged on the top surfaces of the plate-like member and the cantilever beam members, whereby the plate-like member and the cantilever beam members are formed into a double-supported beam-like structure. By virtue of the configuration in which the plurality of members separate from each other are connected to each other by the connection joints 19 on their top surface side, it is possible to easily deform the double-supported beam-like structure downwardly at the time of pull in, and restrain the upward deformation at the time of pull out.

Figure 4:
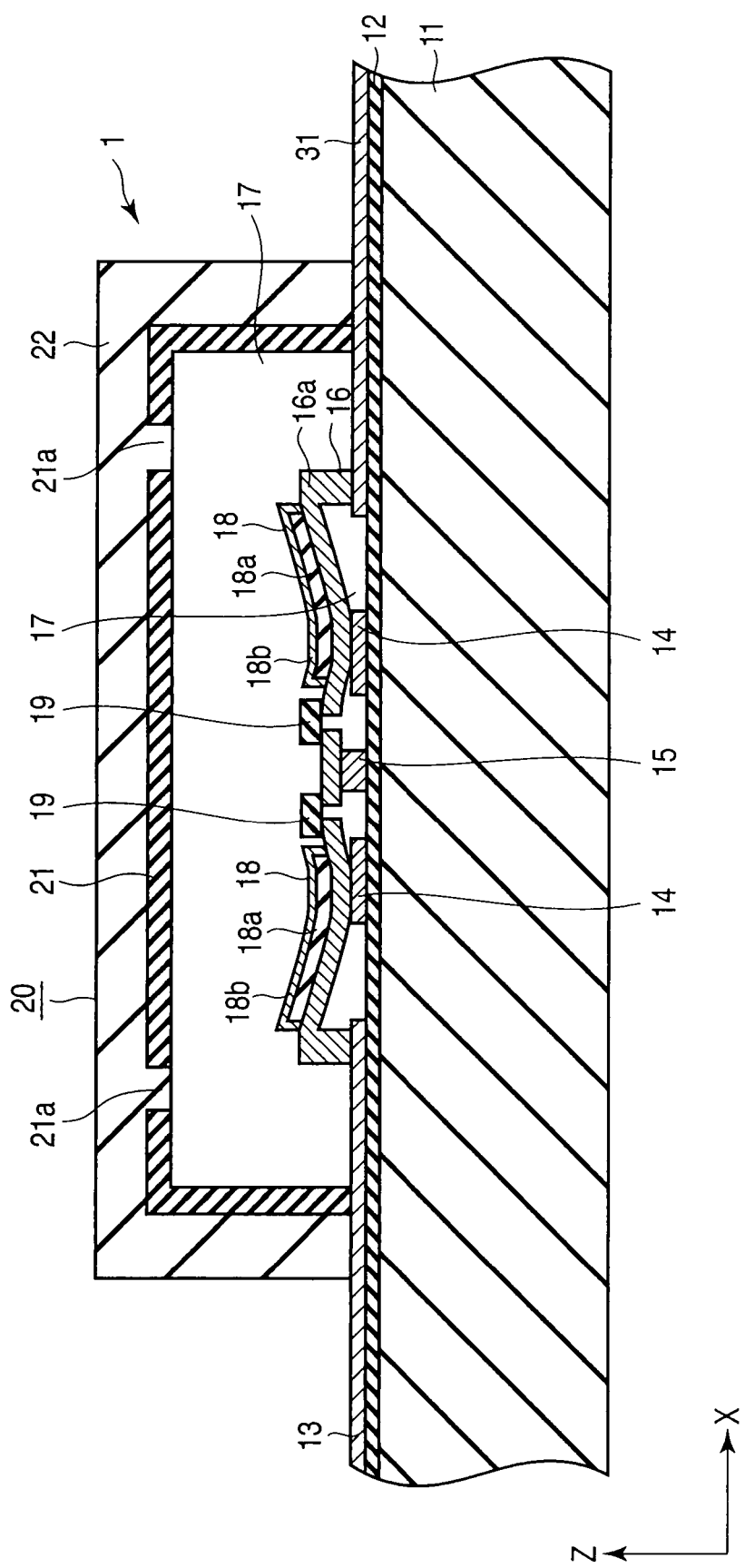
FIG. 4 is a cross-sectional view showing an operation at the time of pull in of the micromechanical device.
Figure 5:
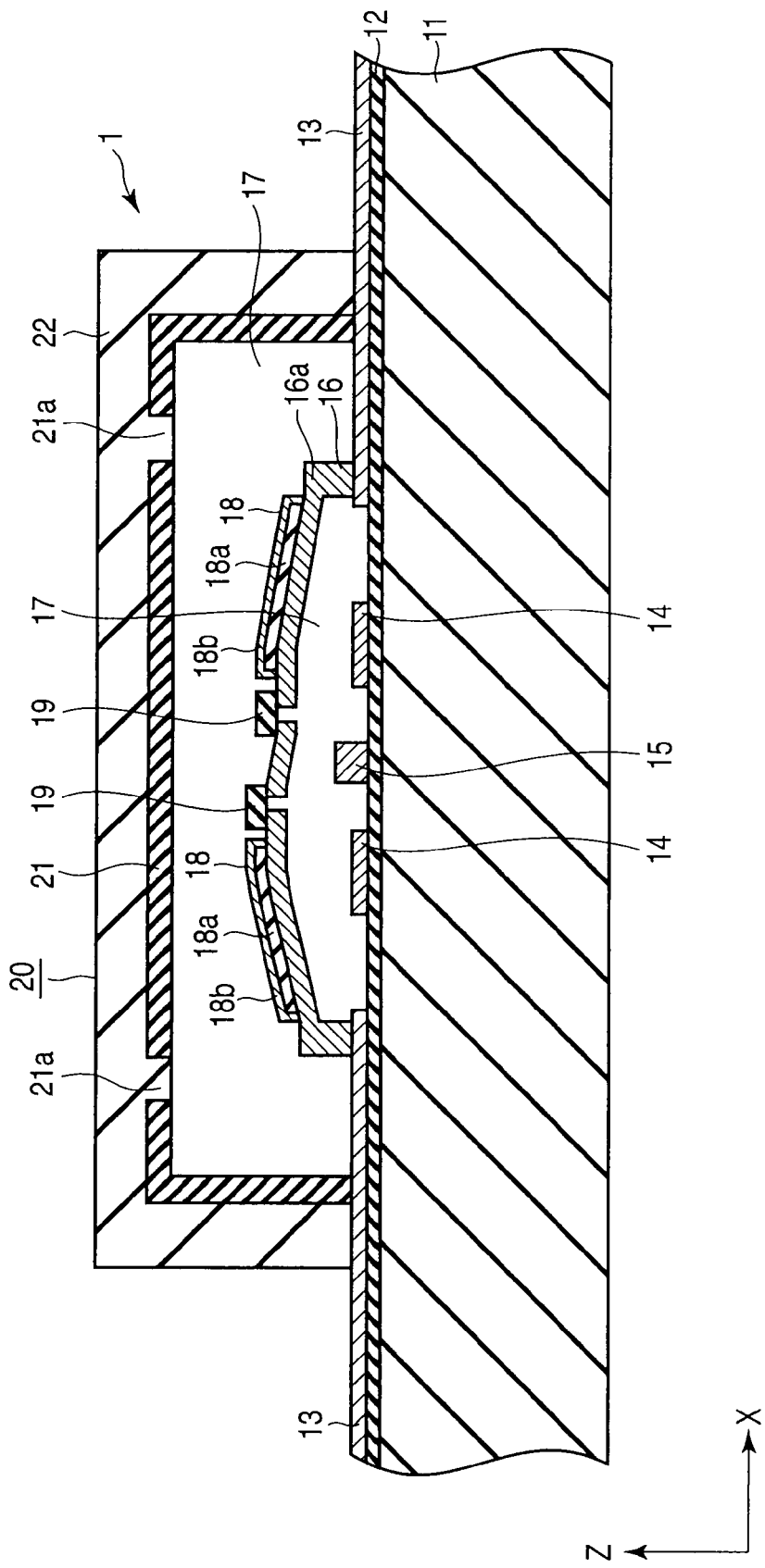
FIG. 5 is a cross-sectional view showing an operation at the time of pull out of the micromechanical device.

This beam-like MEMS element 16 has spring characteristics, can be subjected to elastic bending deformation in the thickness direction in such a manner that the central part thereof is displaced in the up-and-down direction (Z direction in FIG. 2), and has elastic resilience. By applying drive force such as electrostatic force or the like from the drive electrodes 14 as a function of the electric field, the MEMS element 16 is elastically deformed as shown in FIG. 4, and the central part thereof is made closer to the signal wiring 15. When the drive force is removed, the MEMS element 16 returns to the original position again by its own spring characteristics as shown in FIG. 5.

That is, the MEMS element 16 changes the electric characteristics of the micromechanical device 1 by deforming itself in such a manner that the gap between itself and the signal wiring 15 is changed in accordance with the drive force such as electrostatic force when the drive force is applied thereto or removed therefrom. In accordance with the way in which the electric characteristics are changed, a function such as variable electric capacity, switching, or the like is achieved.

Figure 6:
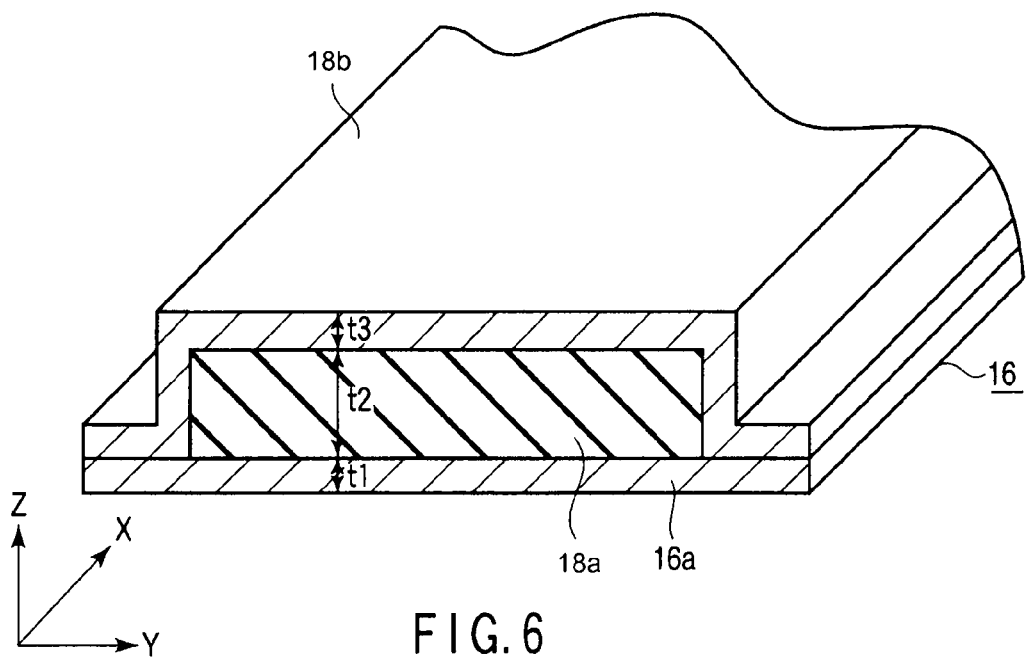
FIG. 6 is a perspective cross-sectional view of the main part of the micromechanical device cut along line AA' in FIG. 2.

As shown in FIGS. 2 and 6, the deformation restraint sections 18 are each constituted of viscous sections 18a formed on the top surface of the MEMS element 16 at positions on both sides of the MEMS element 16 avoiding a part directly above the signal wiring 15, and cover sections 18b for covering the viscous sections 18a from outside.

The viscous section 18a is formed of a synthetic resin having a high viscosity coefficient such as polyimide (PI) into a rectangular shape.

The cover section 18b is constituted of metal or the like, and covers the external surface of the viscous section 18a in such a manner that the viscous section 18a is not exposed.

The cover section 18b covers the top surface and the side periphery of the viscous section 18a, and the periphery of the undersurface thereof is connected to the top surface periphery of the MEMS element 16. The viscous section 18a is prevented from deteriorating, and is further prevented from being removed at the time of sacrificial layer removal to be described later, by the cover section 18b and the MEMS element 16.

By the configuration described above, it is possible to restrain deformation of the MEMS element 16 at the time of pull out while keeping the MEMS element 16 itself thin, and hence it is possible to secure the easiness of deformation at the time of pull in.

In the first sealing body 21 shown in FIG. 2, the peripheral edge part thereof is joined to the top surface of the surrounding insulating layer 12 at a position separate from the MEMS element 16, and the central part thereof covers the MEMS element 16 from above with the hollow section 17 located therebetween. That is, the first sealing body 21 is separate from the MEMS element 16.

The first sealing body 21 has a film-like shape constituted of $SiO_2$ or the like having a thickness of about 1 to 2 μm, and is arranged in such a manner that a distance of several to several tens μm is held between the first sealing body 21 and the MEMS element 16. For example, as will be described later, after a sacrificial layer having a thickness of about several tens μm is formed, the first sealing body 21 is formed thereon, and then the sacrificial layer 23 is removed, whereby it becomes possible to form the hollow section 17.

The first sealing body 21 is provided with a plurality of opening shape sections 21a which are openings formed to introduce a dry etching gas ($O_2$ plasma gas or the like) for removing the sacrificial layer. The opening shape sections 21a are formed around the MEMS element 16 at positions avoiding a part directly above the MEMS element 16 in a line at intervals of, for example, 50 μm.

The outside of the first sealing body 21 including the opening shape sections 21a is covered with the second sealing body 22. The second sealing body 22 has a thickness of about 1 to 2 μm, is constituted of a material such as silicon nitride (SiN), covers the outside of the second sealing body 22, and is film-formed so that the hollow section 17 can be hermetically sealed.

The opening shape sections 21a are hermetically sealed by the second sealing body 22.

In the micromechanical device 1 configured as described above, at the pull in time at which the drive current is applied, the undersurface of the plate-like member of the central part of the MEMS element 16 is brought into contact with the signal wiring 15, and the undersurfaces of the parts in the right and left vicinity of the central part of the MEMS element 16 are brought into contact with the drive electrodes 14. At the time of pull out at which the drive current is removed, the elastic resilience is produced as shown in FIG. 5, whereby the plate-like member of the central part is deformed in the direction in which the plate-like member is separated from the signal wiring 15 and the drive electrodes 14. At this time, the vibration is immediately settled by the high viscosity of the deformation restraint sections 18 arranged at the upper part of the MEMS element 16. Accordingly, it is possible to shorten the damping time after the removal of the power.

Next, a method of manufacturing the micromechanical device 1 according to this embodiment will be described below with reference to FIGS. 7 to 18.

First, as shown 7, an insulating layer 12 is formed on a base substrate 11, and signal wiring 15 is formed on the insulating layer 12. Then, an electrostatic drive high-frequency switch having a cantilever structure using Au as a constituent material is formed.

Figure 8:
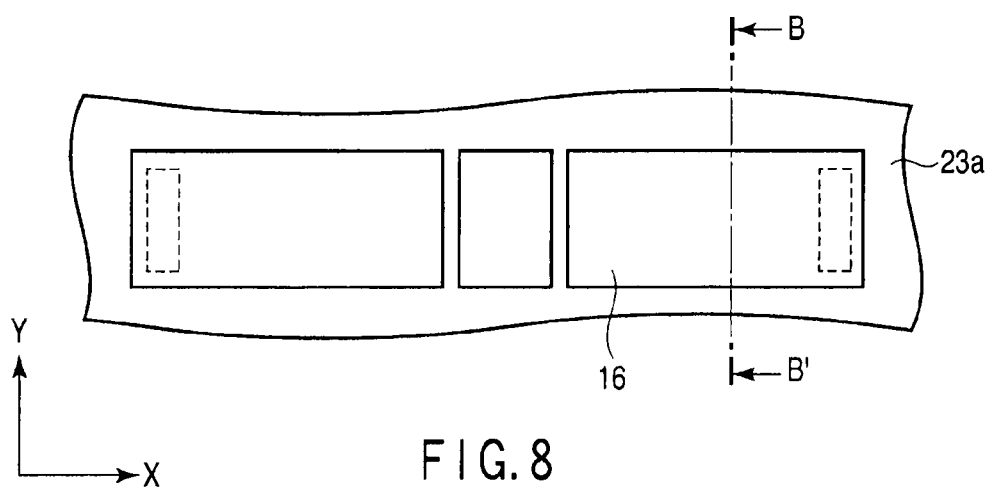
FIG. 8 is a plan view showing a manufacturing process of the micromechanical device.
Figure 9:
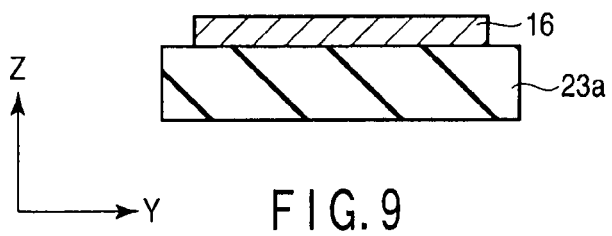
FIG. 9 is a cross-sectional view showing a manufacturing process of the micromechanical device.
Figure 7:
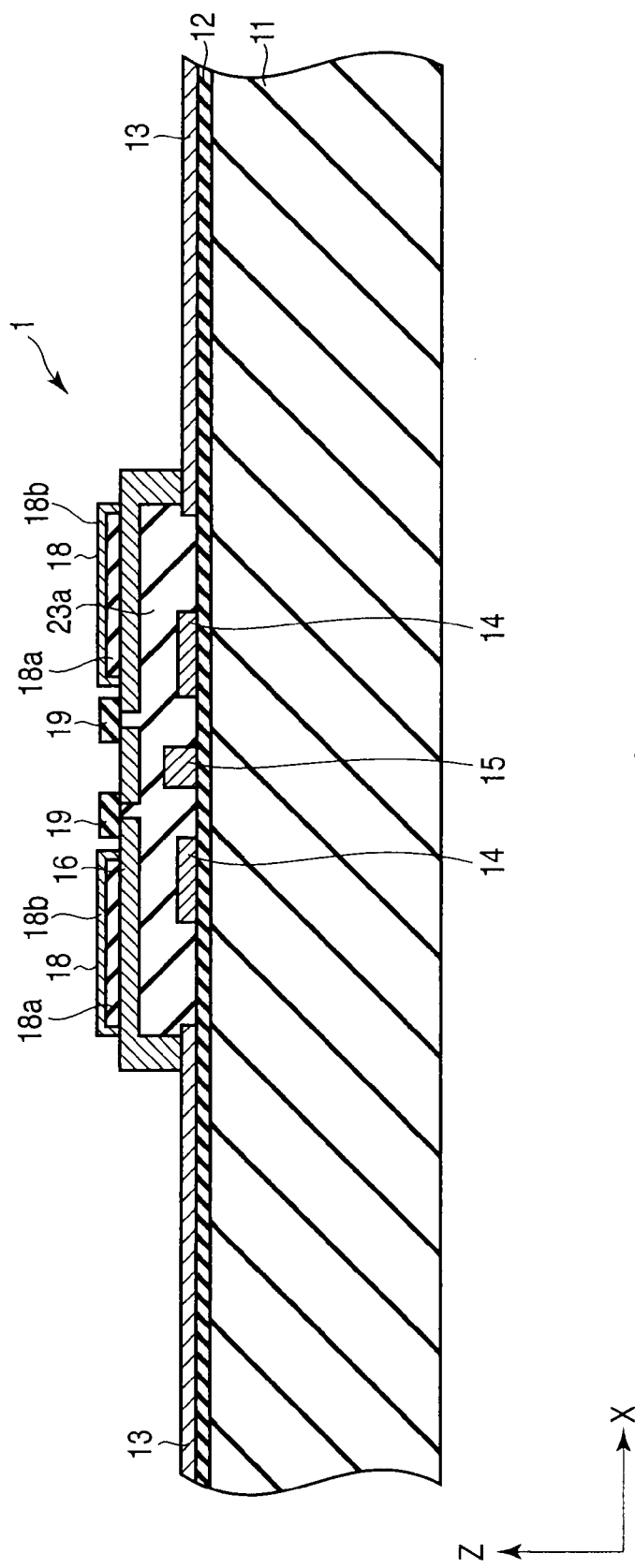
FIG. 7 is a cross-sectional view showing a manufacturing process of the micromechanical device.

At this time, as shown in FIGS. 7 to 9, first, in order to secure a gap between the signal wiring 15 and the MEMS element 16, a sacrificial layer 23a having a predetermined shape, to be completely removed in the later process is formed on the signal wiring 15 to form a step, and then a MEMS element 16 is formed on the sacrificial layer 23a. As a result of this, the MEMS element 16 is formed into a predetermined double-supported beam shape having a step, and a beam part separate from the signal wiring 15.

Subsequently, as shown in FIGS. 10 and 11, viscous sections 18a each constituted of a viscous resin such as PI are formed on the MEMS element 16 by spin coating or spray coating.

Subsequently, as shown in FIGS. 12 and 13, each of the viscous sections 18a is formed into a predetermined rectangular shape by etching or the like. As a result, the rectangular viscous sections 18a are formed on both the right and left sides at positions avoiding the part directly above the signal wiring 15.

Subsequently, as shown in FIGS. 14 and 15, a metallic cover section 18b is formed on each of the viscous sections 18a to a thickness of about 1 μm by the spin coating method. As a result of this, the top surface and the peripheral side surface of each of the viscous sections 18a are covered with the cover section 18b.

Figure 16:
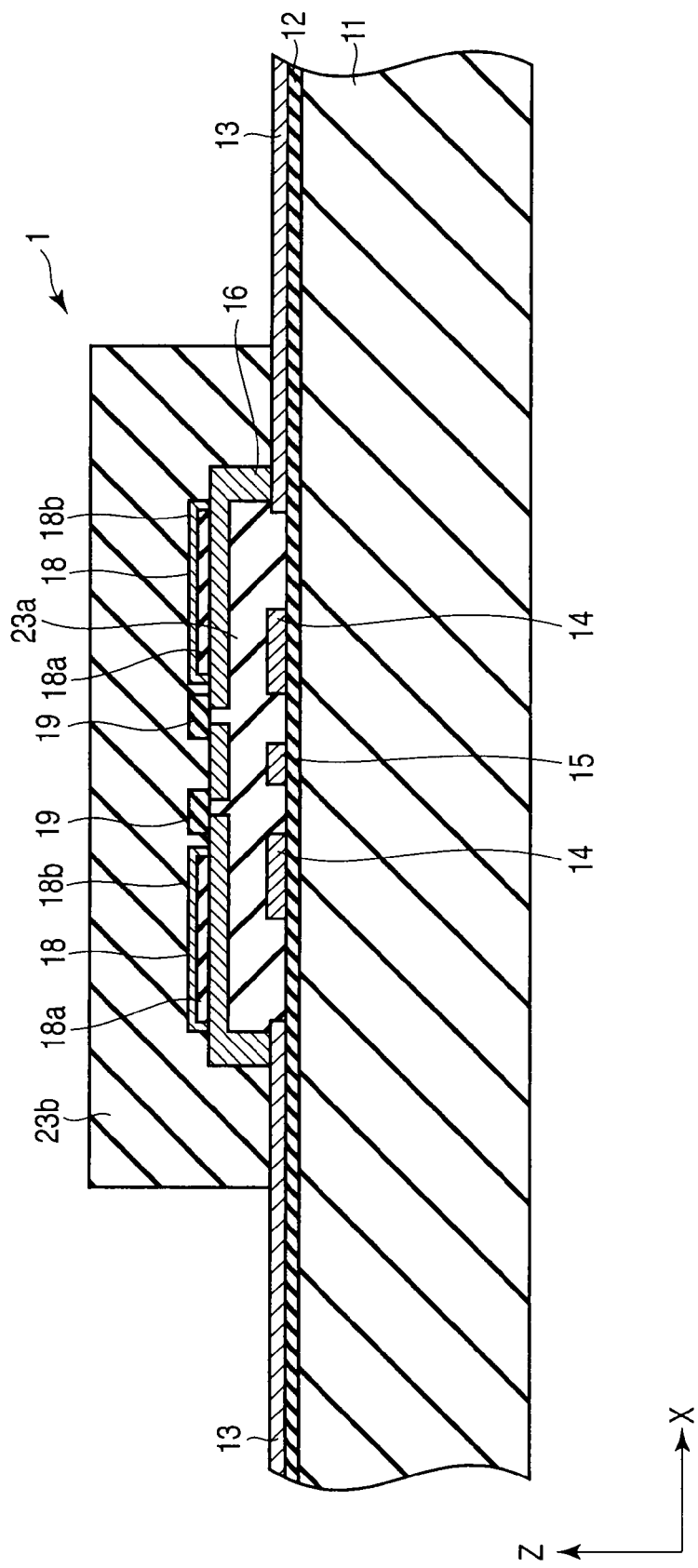
FIG. 16 is a cross-sectional view showing a manufacturing process of the micromechanical device.

Furthermore, as shown in FIG. 16, on the structure in which the MEMS element 16 and the deformation restraint sections 18 are formed, a sacrificial layer 23b is formed to cover the MEMS element 16.

As for each of the sacrificial layers 23a and 23b, the PI film is formed by, for example, the spin coating method, the film is formed into a predetermined shape by patterning, and then is cured, thereby constituting the sacrificial layer.

As shown in FIG. 17, after the sacrificial layers 23a and 23b are formed, an $SiO_2$ film is formed in a predetermined thickness as the first sealing body 21 by using a plasma enhanced CVD system.

Figure 18:
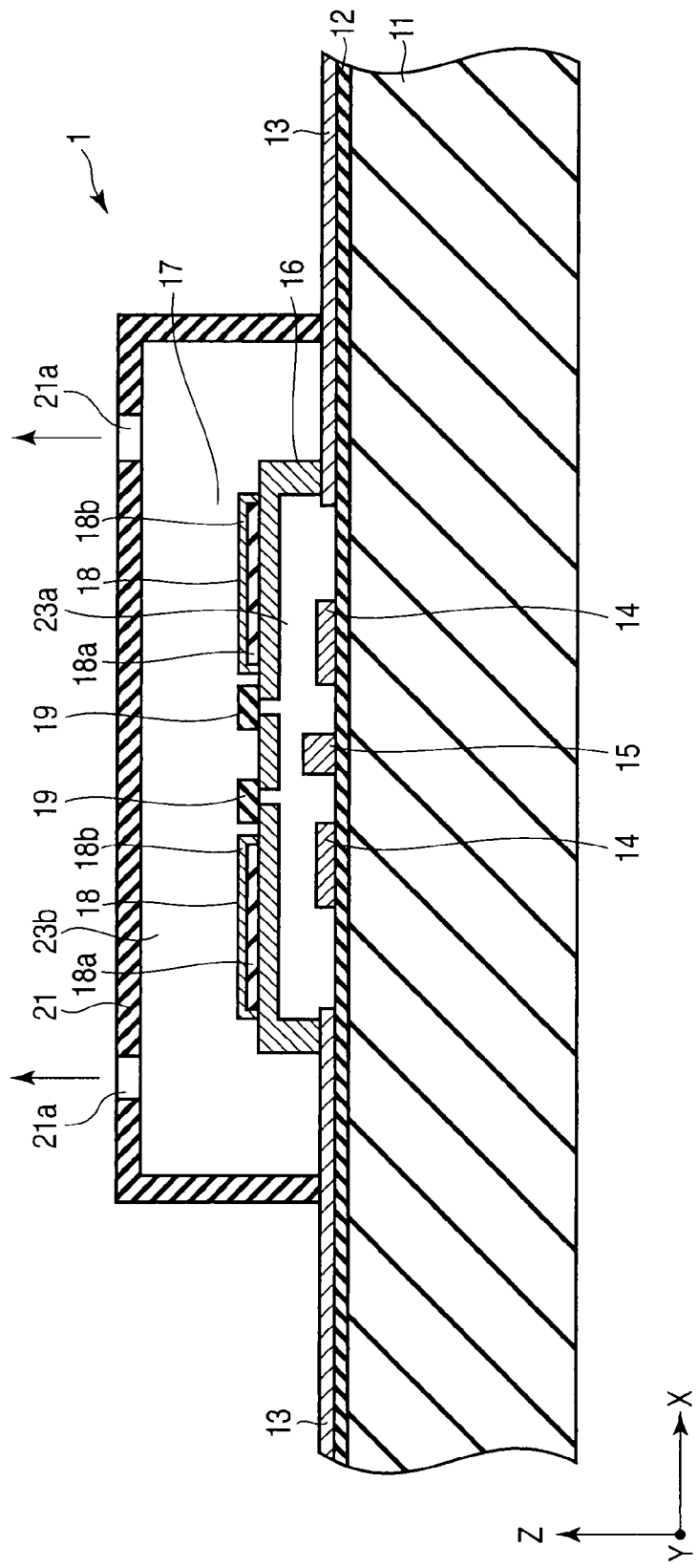
FIG. 18 is a cross-sectional view showing a manufacturing process of the micromechanical device.
Figure 19:
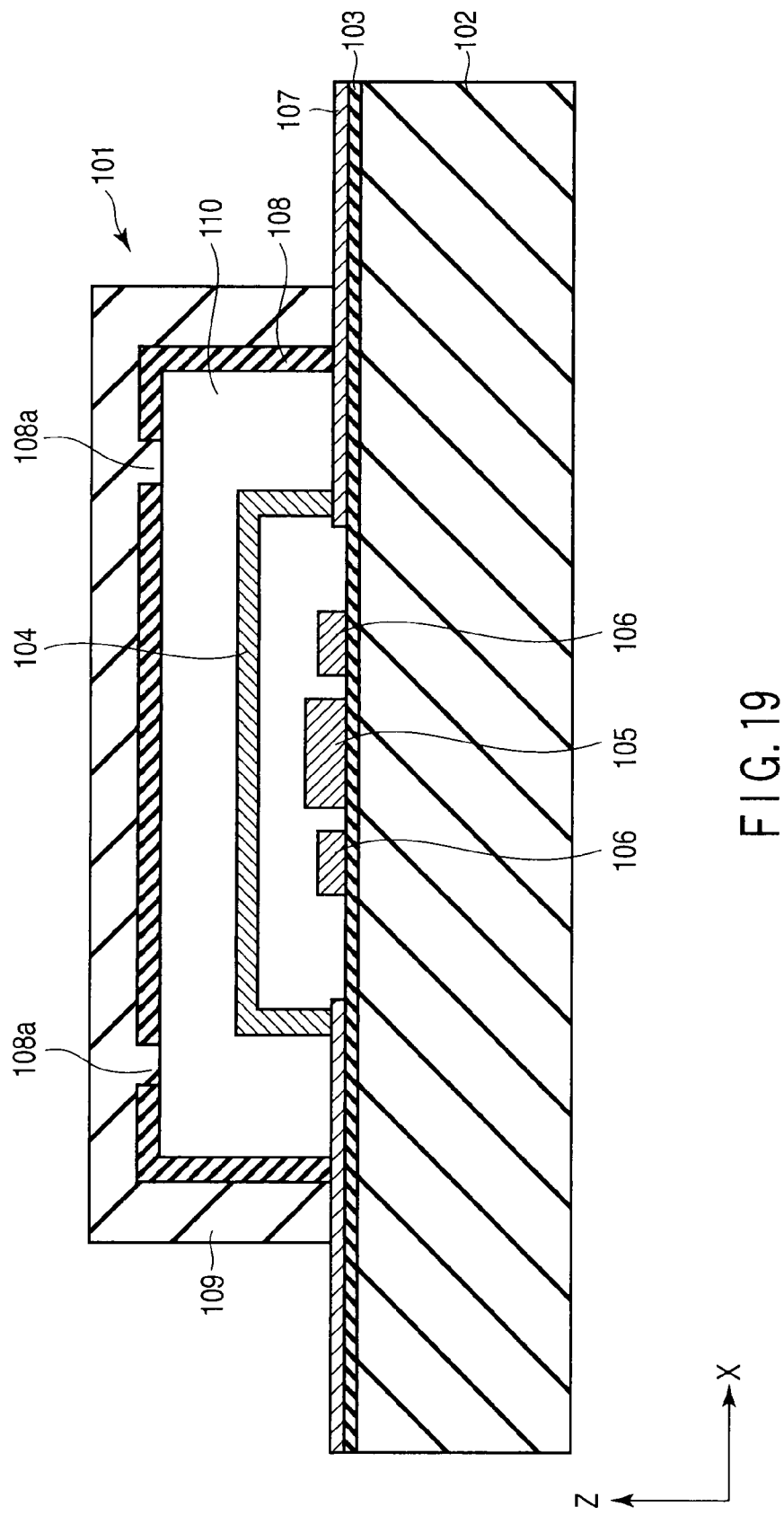
FIG. 19 is a cross-sectional view of an example of a micromechanical device.
Figure 20:
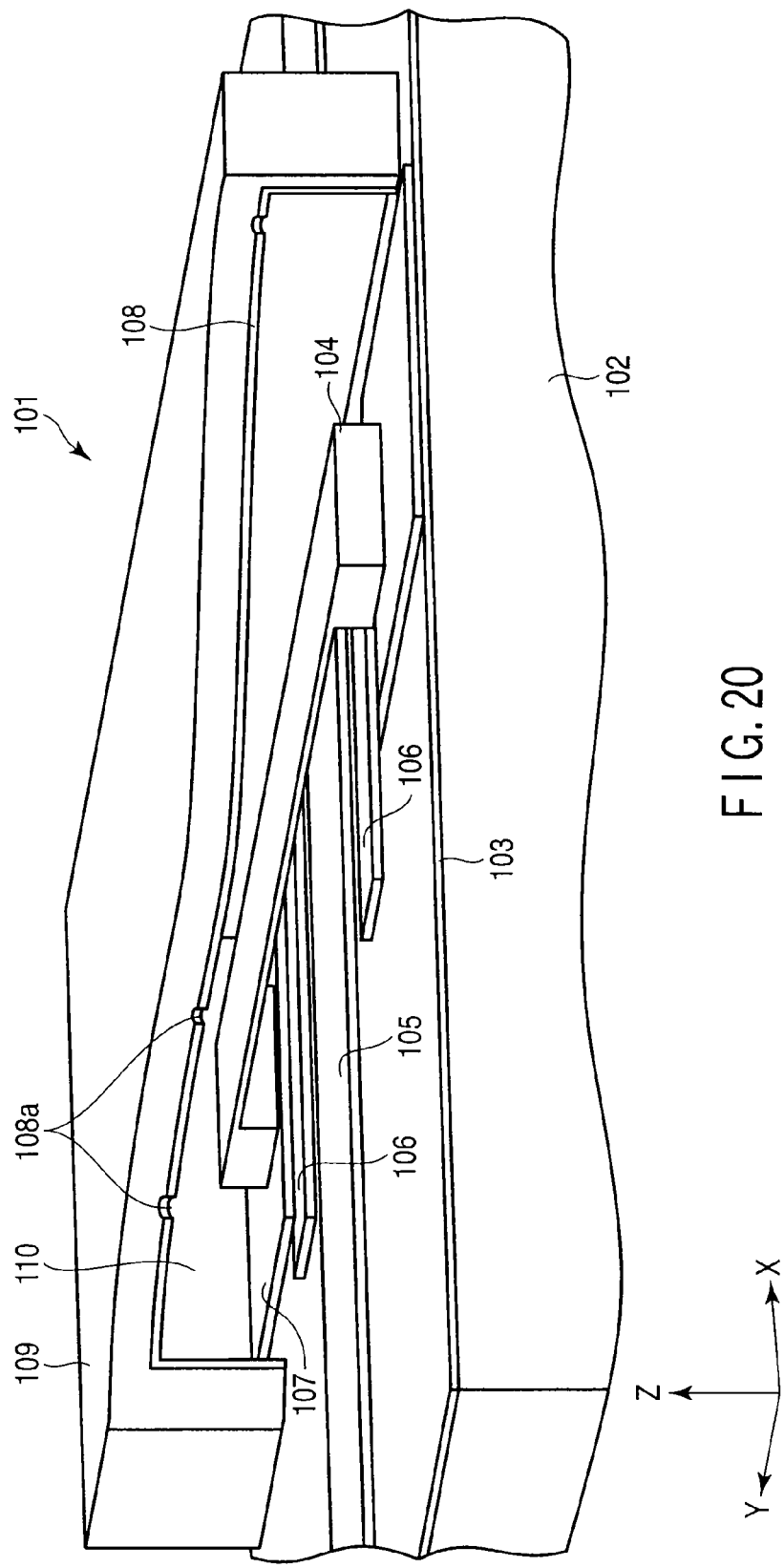
FIG. 20 is a perspective view of an example of a micromechanical device.
Figure 21:
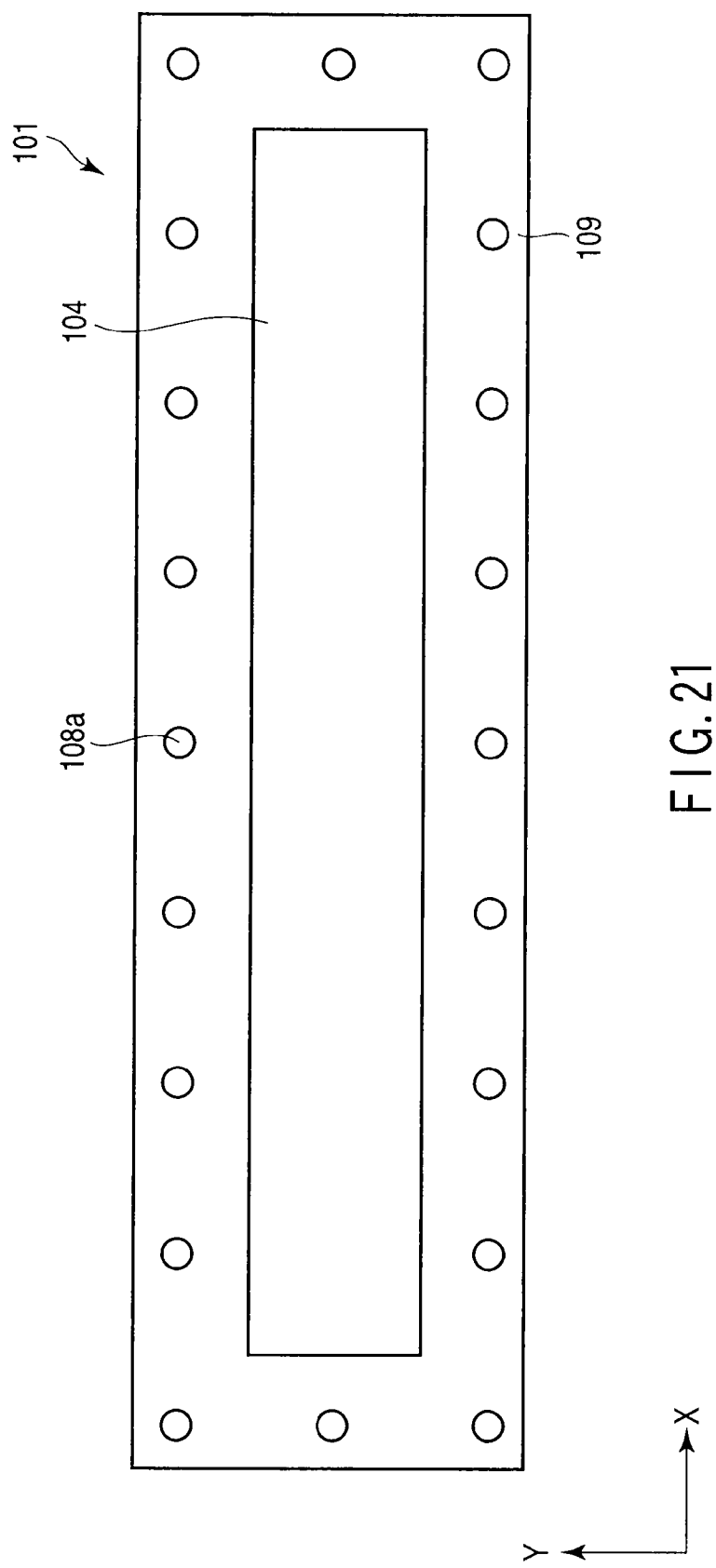
FIG. 21 is a plan view of an example of a micromechanical device.

Furthermore, as shown in FIG. 18, a plurality of opening shape sections 21a which are openings for sacrificial layer removal for introducing a removing agent when the sacrificial layers 23a and 23b around the MEMS element 16 are removed during or after film formation, and are to be blocked up after removal of the sacrificial layers, are formed in the first sealing body 21 by a photolithographic process or the like.

Subsequently, an etching agent for removing the sacrificial layers is introduced from the opening shape sections 21a, and all the sacrificial layers 23a and 23b, are completely removed. For example, an $XeF_2$ gas for selectively removing polycrystalline silicon is introduced from the opening shape sections 21a, whereby all the sacrificial layers are removed. As a result of this, in the inside to be covered with the first sealing body 21 and the second sealing body 22, the hollow section 17 is formed.

Subsequently, as shown in FIG. 2, a film of SiN having low moisture permeability is formed on the first sealing body 21 to cover the first sealing body 21 to a thickness of, for example, several μm or more by using, for example, a plasma enhanced CVD system or a sputtering system to thereby form the second sealing body 22. By forming the second sealing body 22 by the thin film process, the opening shape sections 21a of the first sealing body are tightly sealed, whereby the airtightness of the hollow section 17 is maintained, and the gas inside the section 17 is prevented from leaking out.

The first and second sealing bodies 21 and 22 are formed of an inorganic material such as SiO and SiN having insulating characteristics, and do not form electrostatic capacity between themselves and the MEMS element 16 having conductivity. Thus, in an electromechanical component to be used as variable electrostatic capacity, performance having large capacity variation can be realized.

In this way, the micromechanical device 1 shown in FIGS. 1 and 2 is completed. The package as the micromechanical device 1 configured in the manner described above can be used for, for example, a driver IC chip and the like.

The micromechanical device and the method of manufacturing the micromechanical device according to this embodiment exert the effects stated below. That is, the deformation restraint sections 18 are provided at the upper part of the MEMS element 16, whereby it is possible to restrain the vibration produced by the elastic resilience of the MEMS element 16 when the drive power is removed. It should be noted that the deformation restraint sections 18 are provided at only the upper part of the MEMS element 16, and hence the deformation restraint sections 18 have little influence on the characteristics of the MEMS element 16 exerted at the time of pull in at which the element 16 is downwardly deformed to be brought into contact with the signal wiring 15.

For example, it is possible to make the attenuation factor of the vibration at the central position of the beam-like part shown in FIG. 2 three times or more larger than a hollow sealed structure in which the deformation restraint sections 18 are not provided. Accordingly, it is possible to suppress noise in the output signal, and improve the accuracy of the device as a component.

Moreover, the sealing bodies 21 and 22 are formed of an inorganic material such as $SiO_2$ and SiN having insulating characteristics, and hence they do not form electrostatic capacity between themselves and the MEMS element 16 having conductivity. Thus, in an electromechanical component to be used as variable electrostatic capacity avoiding formation of capacity between the MEMS element 16 and the peripheral conductors, performance having large capacity variation can be realized.

It should be noted that the present invention is not limited to the embodiment described above, and can be carried out by appropriately modifying the materials of the constituent elements, shapes, arrangements, sizes, structures/operations, and the like. For example, in the above-mentioned embodiment, the case where the MEMS element 16 is formed by connecting the plurality of members through the connection joints 19 has been described. However, the present invention can be applied to a case where the MEMS element is constituted of a single beam-like member.

Further, examples of the patterning method, and the method of removing the sacrificial layer include dry etching using an etching gas, wet etching using a chemical solution, and the like. Further, the plural sacrificial layers 23a and 23b may not be formed of the same material. Further, the structure in which the insulating layer 12 is provided on the base substrate 11 has been described as the substrate. However, the substrate may be constituted of only the base substrate 11 with the insulating layer 12 omitted, and the MEMS element 16, and the signal wiring 15 may be formed on the base substrate 11. Besides, the present invention can be embodied in the implementation stage by modifying the constituent elements within the scope not deviating from the gist of the invention. Further, by appropriately combining a plurality of constituent elements disclosed in the embodiment described above, various inventions can be formed. For example, some constituent elements may be deleted from the entire constituent elements shown in the embodiment. Further, constituent elements of different embodiments may be appropriately combined with each other.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A micromechanical device comprising:
   a substrate in which a signal line is provided on a principal surface;
   a micromachine which is mounted on the principal surface of the substrate, is formed of a conductive material into a beam-like shape, is elastically deformed by a function of an electric field in such a manner that the beam-like shape moves closer to or apart from the signal line, and changes electric characteristics concomitantly with the deformation;
   a deformation restraint section constituted of a material having a higher viscosity coefficient than the conductive material, provided on the opposite side of the micromachine to the signal line, for restraining deformation of the micromachine in a direction in which the micromachine is separated from the signal line; and
   a sealing body provided on the principal surface of the substrate, for covering the micromachine with a hollow section located therebetween, wherein
   the deformation restraint section includes a viscous section, which is formed on the micromachine, constituted of a synthetic resin material, and has surfaces covered by a cover section.

2. The micromechanical device according to claim 1, wherein
   the micromachine is formed into a double-supported beam-like shape supported on the substrate and straddling the signal line, and
   the deformation restraint sections are arranged on both sides of the micromachine in the direction in which the signal line is straddled at positions avoiding a part directly opposed to the signal line.

3. A method of manufacturing a micromechanical device comprising:
   a step of arranging a micromachine which is formed of a conductive material into a beam-like shape, is deformed by a function of an electric field, and changes electric characteristics concomitantly with the deformation, on a principal surface of a substrate on which a signal line is provided;
   a step of arranging deformation restraint sections each constituted of a material having a higher viscosity coefficient than the conductive material, for restraining deformation of the micromachine by which the micromachine is separated from the signal line, on the opposite side of the micromachine to the signal line;
   a step of coating a synthetic resin material on the micromachine;
   a step of covering surfaces of the synthetic resin material with a cover section;

a step of forming a sacrificial layer on the micromachine and the deformation restraint sections;

a step of forming a first sealing body covering the micromachine with the sacrificial layer located therebetween, and including opening shape sections communicating with the sacrificial layer, on the sacrificial layer and the principal surface of the substrate;

a step of introducing a fluid for removing the sacrificial layer from the opening shape sections to thereby remove the sacrificial layer; and a step of forming a second sealing body on the first sealing body to thereby block the opening shape sections.

* * * * *